United States Patent
Wallace et al.

(10) Patent No.: US 9,865,433 B1
(45) Date of Patent: Jan. 9, 2018

(54) GAS INJECTION SYSTEM FOR ION BEAM DEVICE

(71) Applicant: Varian Semiconductor Equipment Associates, Inc., Gloucester, MA (US)

(72) Inventors: Jay Wallace, Danvers, MA (US); Ernest E. Allen, Rockport, MA (US); Richard J. Hertel, Boxford, MA (US); Alexander C. Kontos, Beverly, MA (US); Shurong Liang, Lynnfield, MA (US); Jeffrey E. Krampert, Topsfield, MA (US); Tyler Rockwell, Wakefield, MA (US)

(73) Assignee: Varian Semiconductor Equipment Associats, Inc., Gloucester, MA (US)

( * ) Notice: Subject to any disclaimer, the term of this patent is extended or adjusted under 35 U.S.C. 154(b) by 0 days.

(21) Appl. No.: 15/489,182

(22) Filed: Apr. 17, 2017

Related U.S. Application Data

(60) Provisional application No. 62/436,047, filed on Dec. 19, 2016.

(51) Int. Cl.
*H01J 37/32* (2006.01)
*H01J 37/305* (2006.01)

(52) U.S. Cl.
CPC .... *H01J 37/32449* (2013.01); *H01J 37/3056* (2013.01); *H01J 2237/006* (2013.01); *H01J 2237/3174* (2013.01); *H01J 2237/31749* (2013.01)

(58) Field of Classification Search
USPC .............................................. 250/423 R, 424
See application file for complete search history.

(56) References Cited

U.S. PATENT DOCUMENTS

| 4,714,834 A * | 12/1987 | Shubaly | H01J 27/10 250/427 |
| 2017/0135194 A1 * | 5/2017 | Belchenko | H05H 3/02 |

\* cited by examiner

*Primary Examiner* — Kiet T Nguyen

(57) ABSTRACT

A gas injection system, including an extraction plate having an extraction aperture for allowing passage of an ion beam through the extraction plate, the extraction plate further having a gas slot for expulsion of a residue removal gas from the extraction plate. The gas injection system may include a gas conduit extending through the extraction plate between the gas slot and a gas manifold, a gas source connected in fluid communication with the gas manifold, the gas source containing the residue removal gas. The gas manifold may include a valve adjustable between a first position, wherein the residue removal gas is allowed to flow into the extraction plate, and a second portion, wherein the residue removal gas can be vented from the extraction plate. The gas injection system may further include a manifold cover coupled to the gas manifold.

20 Claims, 8 Drawing Sheets

US 9,865,433 B1

GAS INJECTION SYSTEM FOR ION BEAM DEVICE

RELATED APPLICATIONS

This application claims priority to U.S. Provisional Patent Application No. 62/436,047, filed Dec. 19, 2016, entitled "GAS INJECTION SYSTEM FOR ION BEAM DEVICE," which is incorporated by reference herein in its entirety.

FIELD OF THE DISCLOSURE

Embodiments of the present disclosure relate to the field of ion beam devices, and more particularly to an apparatus and method for injecting residue removal gases into a process chamber of an ion beam device.

BACKGROUND OF THE DISCLOSURE

In order to create desired surface features on a semiconductor wafer or other substrate, an ion beam of prescribed energy may be projected onto the surface of the substrate in a predetermined pattern to "etch" the desired features into the substrate. During this etching process, the substrate can be mechanically driven or "scanned" in a direction transverse to an ion beam projected onto the substrate by an ion source. For example, if an ion beam is projected along a horizontal plane toward a vertically-oriented substrate, the substrate may be scanned in a vertical direction and/or in a lateral direction perpendicular to the projected ion beam. Thus, the entire surface of the substrate can be exposed to the ion beam.

Etching a substrate with an ion beam creates residue in the form of sputtered atoms dislodged from the etched surface of the substrate and redeposited on another portion of the substrate. This residue can be detrimental to the quality of a finished substrate if not removed. In order to remove the residue, a substrate can be exposed to various "residue removal gases," such as methanol, ethanol, or isopropanol before, during, and/or after etching of the substrate. Such residue removal gases may react with atoms sputtered from an etched surface of a substrate to form volatile molecules. These volatile molecules can then be evacuated using vacuum pumps or the like.

Conventionally, residue removal gases are introduced into a process chamber of an ion beam device through a so-called "shower head" structure located adjacent a substrate being processed. In order to provide clearance for the substrate and for components of the ion beam apparatus, the shower head is commonly positioned some distance away from the substrate. Thus, the presence of the shower head necessitates a process chamber significantly larger than would otherwise be necessary. Additionally, since the shower head is positioned a significant distance away from a substrate, the residue removal gases emitted by the shower head diffuse throughout much of the process chamber before drifting into contact with the substrate. Much of the residue removal gases are removed from the process chamber before reaching the surface of the substrate, resulting in inefficient and ineffective delivery of the residue removal gases.

With respect to these and other considerations the present improvements may be useful.

SUMMARY

This Summary is provided to introduce a selection of concepts in a simplified form. This Summary is not intended to identify key features or essential features of the claimed subject matter, nor is this Summary intended as an aid in determining the scope of the claimed subject matter.

An exemplary embodiment of a gas injection system for an ion beam device in accordance with the present disclosure may include an extraction plate having an extraction aperture for allowing passage of an ion beam through the extraction plate, the extraction plate further having a gas slot for facilitating expulsion of gas from the extraction plate.

Another exemplary embodiment of a gas injection system for an ion beam device in accordance with the present disclosure may include an extraction plate having an extraction aperture for allowing passage of an ion beam through the extraction plate, the extraction plate further having a gas slot for facilitating expulsion of a residue removal gas from the extraction plate. This embodiment may further include a gas conduit extending through the extraction plate between the gas slot and a gas manifold mounted to the extraction plate. A gas source may be connected in fluid communication with the gas manifold, the gas source containing the residue removal gas. The gas manifold may include a valve selectively adjustable between a first position, wherein the residue removal gas is allowed to flow into the extraction plate, and a second portion, wherein the residue removal gas can be vented from the extraction plate, and a manifold cover coupled to the gas manifold. The manifold cover may include an electronically-controllable drive mechanism coupled to the valve and adapted to move the valve between the first position and the second position.

An exemplary embodiment of a method of manufacturing an extraction plate for a gas injection system an in accordance with an embodiment of the present disclosure may include forming an elongated extraction aperture in a plate. The method may further include forming a gas slot in a first side of the plate on a first side of the extraction aperture, and forming a network of conduits in the plate for putting the gas slot in fluid communication with a gas source, the network of conduits including a slot conduit intersecting the first gas slot.

BRIEF DESCRIPTION OF THE DRAWINGS

By way of example, various embodiments of the disclosed apparatus will now be described, with reference to the accompanying drawings, wherein:

FIG. 3a is a cutaway view illustrating an exemplary extraction plate in accordance with the present disclosure;

FIG. 3b is a detail view illustrating a portion of the extraction plate shown in FIG. 3a;

DETAILED DESCRIPTION

Figure 1:
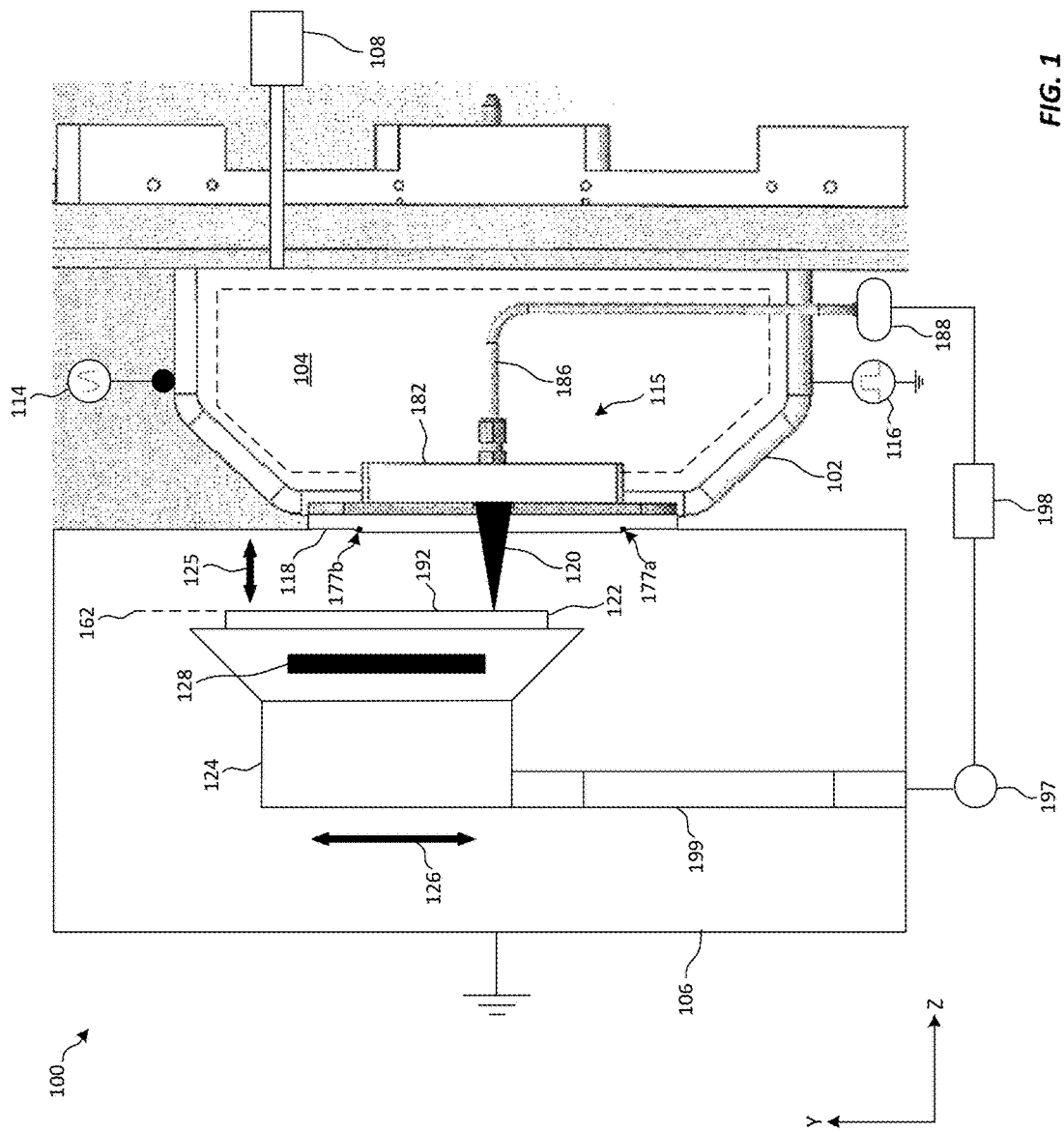
FIG. 1 is side cross-sectional view illustrating an exemplary embodiment of an ion beam device in accordance with the present disclosure.

The present embodiments will now be described more fully hereinafter with reference to the accompanying drawings, wherein some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide a novel system and method for treating substrates, and in particular a novel gas injection system and method of manufacturing the same, such system adapted to remove residual etched material from a substrate surface. In particular embodiments, an extraction plate having integrated gas slots for emitting one or more residue removal gases in close proximity to a substrate surface before, during, and/or after etching of the surface is disclosed.

FIG. 1 depicts an ion beam device 100 (hereinafter "the device 100") according to an exemplary embodiment of the present disclosure. The device 100 may include a plasma chamber 102. The plasma chamber 102 may house a plasma 104 as illustrated. The device 100 further may further include a process chamber 106. The device 100 may include at least one gas source 108 for providing a working gas (described below) to the plasma chamber 102. The device 100 may further include a power source, shown as the plasma power source 114, to generate power to ignite and sustain the plasma 104. The plasma power source 114 may be an RF power source, inductively-coupled plasma (ICP) source, capacitively coupled plasma (CCP) source, helicon source, electron cyclotron resonance (ECR) source, indirectly heated cathode (IHC) source, glow discharge source, or other plasma sources known to those skilled in the art. The device 100 may further include a gas injection system 115 for introducing a residue removal gas into the process chamber 106 as further described below. The device 100 may further include a bias supply 116 coupled to the plasma chamber 102.

The bias supply 116 may be configured to generate a voltage difference between the plasma chamber 102 and a substrate stage 124 disposed in the process chamber 106. In the embodiment of FIG. 1, the bias supply 116 may bias the plasma chamber 102 positively with respect to ground potential, while the process chamber 106 and substrate stage 124 are held at ground potential. When the plasma 104 is present in the plasma chamber 102, and the bias supply 116 biases the plasma chamber 102 positively with respect to ground potential, an ion beam 120 comprising positive ions may be extracted from the plasma 104. In other embodiments of the device 100, the plasma chamber 102 may be held at ground potential and the substrate 122 and substrate stage 124 may be biased positively with respect to ground potential.

The ion beam 120 may be extracted through an extraction plate 118, and may be directed into the process chamber 106 to a substrate 122 held on the substrate stage 124. In various embodiments, the substrate stage 124 may be movable with respect to the extraction plate 118. For example, the substrate stage 124 may be movable in a direction parallel to the Z-axis of the Cartesian coordinate system as indicated by arrow 125. In this manner, a distance between the surface of the substrate 122 and extraction plate 118 may be varied. In various embodiments, the substrate stage 124 may be configured to scan the substrate 122 relative to the extraction plate 118 in a direction parallel to the plane 162 of the substrate 122. For example, as shown in FIG. 1, the substrate stage 124 may be vertically movable parallel to the Y-axis as indicated by arrow 126. As further shown in FIG. 1, the substrate stage 124 may include a heater 128 for heating the substrate 122.

In accordance with various embodiments of the present disclosure, the gas source 108 of the device 100 may supply one more feed gases to the plasma chamber 102 for use in generating the plasma 104. Such feed gases may include neon gas, xenon gas, krypton gas, and argon gas. Ion beams extracted from plasma formed from one or more of the aforementioned noble gases have been found to be effective for etching various substrate materials, including silicon.

Figure 2:
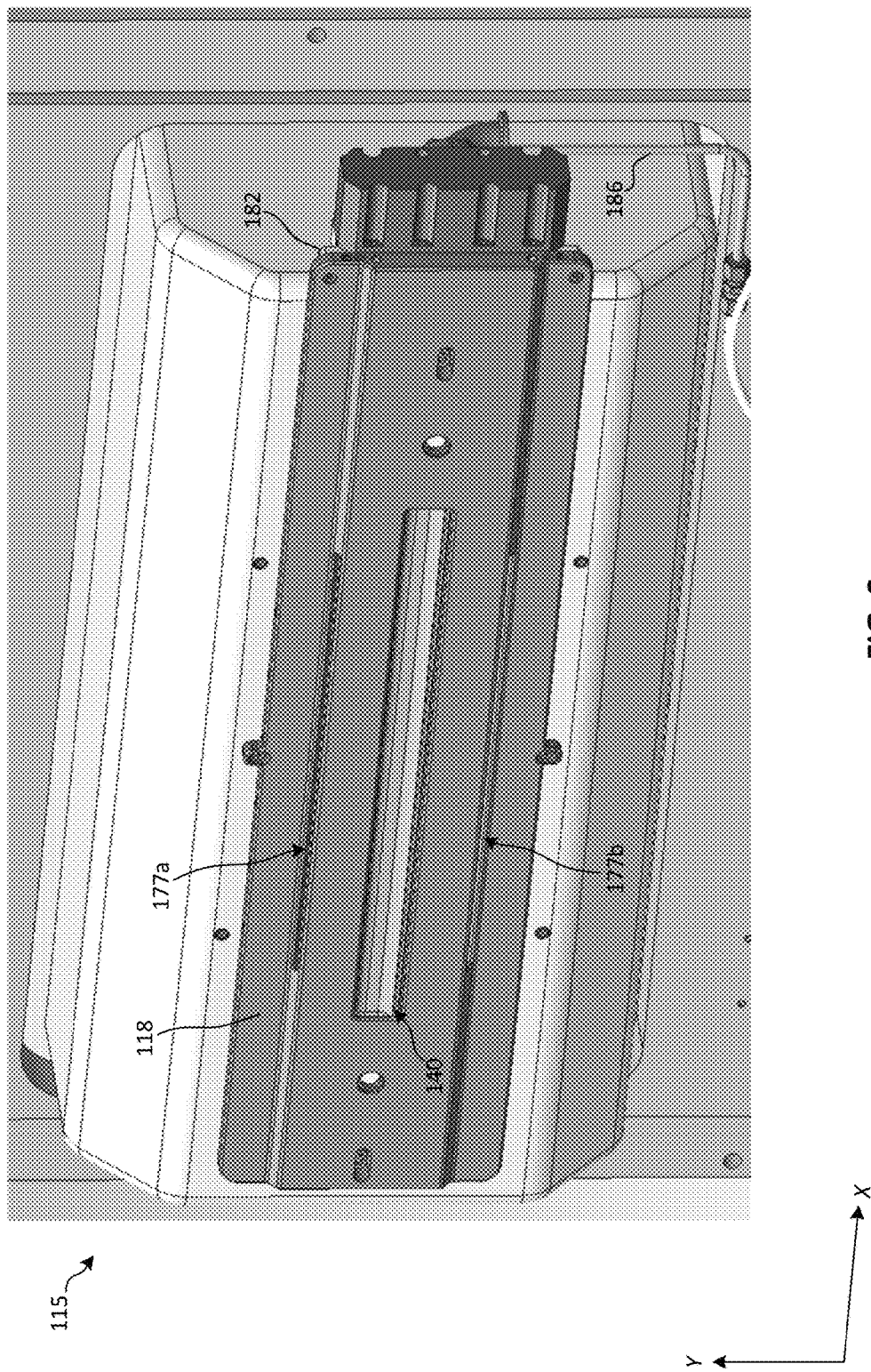
FIG. 2 is a perspective view illustrating an exemplary embodiment of a gas injection system in accordance with the present disclosure.

Referring to FIG. 2, a perspective view illustrating the exemplary gas injection system 115 of the device 100 is shown. The gas injection system 115 may include an extraction plate 118 having an extraction aperture 140 formed therethrough for allowing passage of the ion beam 120 (FIG. 1). The extraction aperture 140 may have a width along the X-axis and a height along the Y-axis, where the width is greater than the height. In some examples, the width may have a value in the range of 150 mm to 450 mm or greater, while the height may have a value in the range of 3 mm to 30 mm. The embodiments of the present disclosure are not limited in this context. Thus, the ion beam 120 (FIG. 1) may be extracted through the extraction aperture 140 as a ribbon beam having a beam width greater than a beam height.

The extraction plate 118 may be provided with first and second elongated, horizontally-oriented gas slots 177a, 177b located above and below the extraction aperture 140, respectively, for emitting one or more residue removal gases into the process chamber 106 (FIG. 1). The gas slots 177a, 177b may be in fluid communication with a network of conduits extending through an interior of the extraction plate 118 (described in detail below) connecting the first and second gas slots 177a, 177b to a gas manifold 182 mounted to a rear of the extraction plate 118. The gas manifold 182 may be connected to a gas supply line 186 for supplying a residue removal gas to the gas manifold 182 from a pressurized gas source 188 (FIG. 1). The gas source 188 may contain one or more residue removal gases selected for the ability to react with sputtered atoms from the etched surface 192 of the substrate 122 (FIG. 1) to form volatile molecules for subsequent removal from the process chamber 106 of the device 100. Such residue removal gases may include, and are not limited to, methanol, ethanol, isopropanol, acetone, carbon monoxide, carbon dioxide, ammonia, nitrous oxide, ethylene glycol, chlorine, fluorine, nitrogen trifluoride, and hydrogen cyanide.

Figure 3:
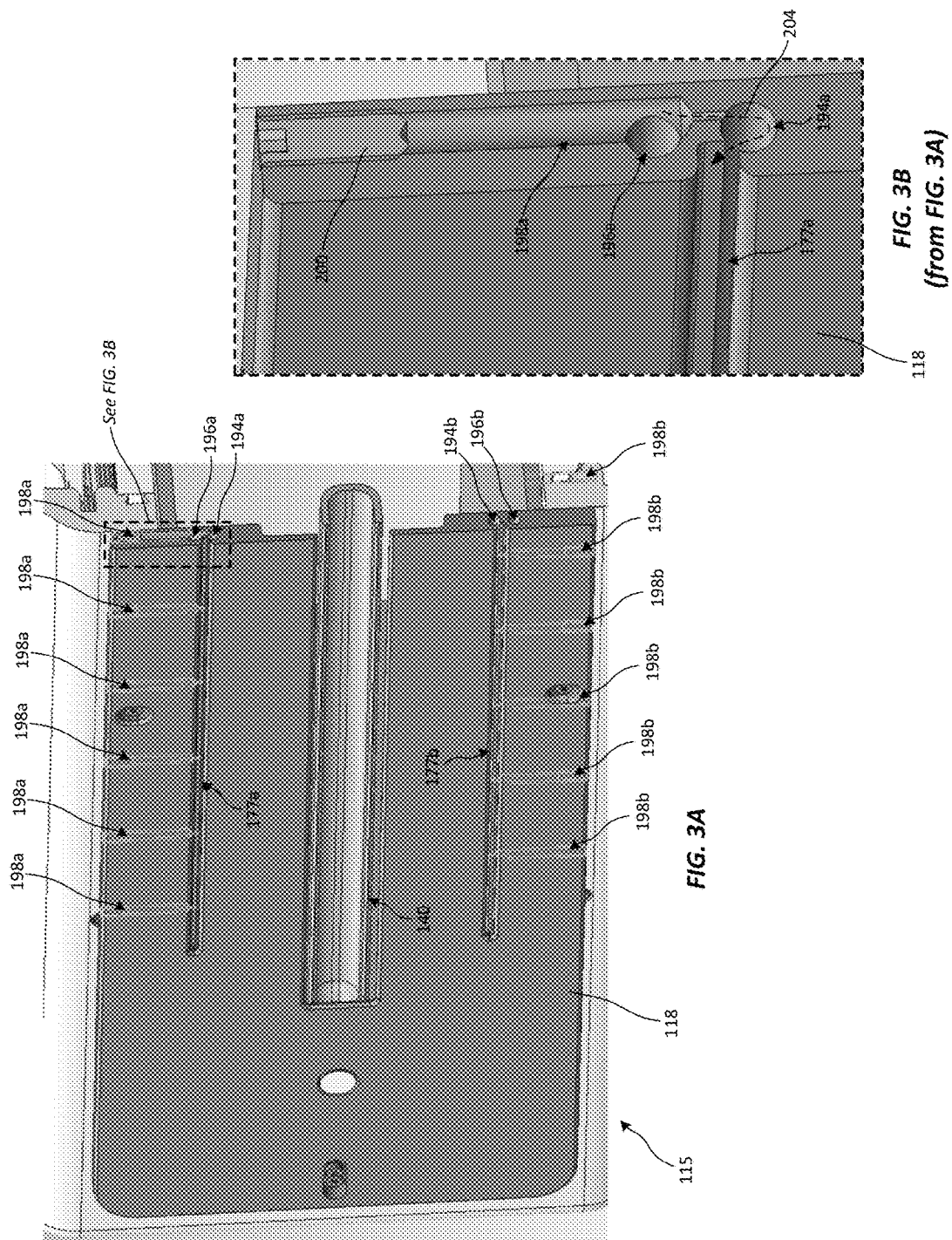

Referring to FIGS. 3A and 3B, a perspective cut-away view and a detailed cut-away view illustrating various internal gas conduits extending through the extraction plate 118 are shown. These may include horizontally-oriented slot conduits 194a, 194b extending parallel to the face of the extraction plate 118, located below and above, and contiguous with, the gas slots 177a, 177b (e.g., the gas slots 177a, 177b may be formed by the intersections of the slot conduits 194a, 194b with the front surface of the extraction plate 118). The extraction plate 118 may further include horizontally-oriented manifold conduits 196a, 196b extending parallel to the face of the extraction plate 118 and located above and below the slot conduits 194a, 194b, respectively. The slot conduits 194a, 194b may be connected to the manifold conduits 196a, 196b by respective series of vertically-oriented, horizontally-spaced interconnect conduits 198a, 198b extending from top and bottom edges of the extraction plate 118, respectively.

As will be described in greater detail below, residue removal gas may flow from the manifold conduits 196a, 196b, through the interconnect conduits 198a, 198b, to the slot conduits 194a, 194b, and may be expelled from the extraction plate 118 through the gas slots 177a, 177b as indicated by the dashed arrow 204 shown in FIG. 3B. Notably, due to the arrangement of the manifold conduits 196a, 196b above and below the slot conduits 194a, 194b, respectively, residue removal gas may be expelled from the gas slots 177a, 177b along diagonally-upward and diagonally-downward paths, respectively, vertically away from the extraction aperture 140. Thus, when the residue removal gas strikes the surface 192 of the substrate 122 (FIG. 1), residual material may be blown off the surface 192 and vertically away from the extraction aperture 140. Thus, the residue is prevented from flowing toward and through the extraction aperture 140 and into the plasma chamber 102, where the residue may react with the plasma 104 in an undesirable manner.

The portions of the interconnect conduits 198a, 198b extending between the manifold conduits 196a, 196b and the slot conduits 194a, 194b, respectively, may be sized (e.g., may be formed with particular diameters) to control gas delivery (e.g., gas pressure) in a desired manner. In some embodiments, replaceable nozzles or jets may be disposed within the portions of the interconnect conduits 198a, 198b extending between the manifold conduits 196a, 196b and the slot conduits 194a, 194b to facilitate selective variation of gas delivery by implementing nozzles or jets with orifices of different diameters.

In some embodiments of the extraction plate 118, the slot conduits 194a, 194b, manifold conduits 196a, 196b, and interconnect conduits 198a, 198b may be formed by cross-drilling the extraction plate 118 from the horizontal and vertical edges thereof. Certain of the conduits may be plugged to prevent gas from escaping the extraction plate 118. For example, as best shown in FIG. 3B, the interconnect conduit 198a, being representative of all the interconnect conduits 198a shown in FIG. 3A, may be plugged with a removable plug 200 extending into the interconnect conduit 198a from the top edge of the extraction plate 118. The interconnect conduits 198b may be provided with similar plugs.

Figure 4:
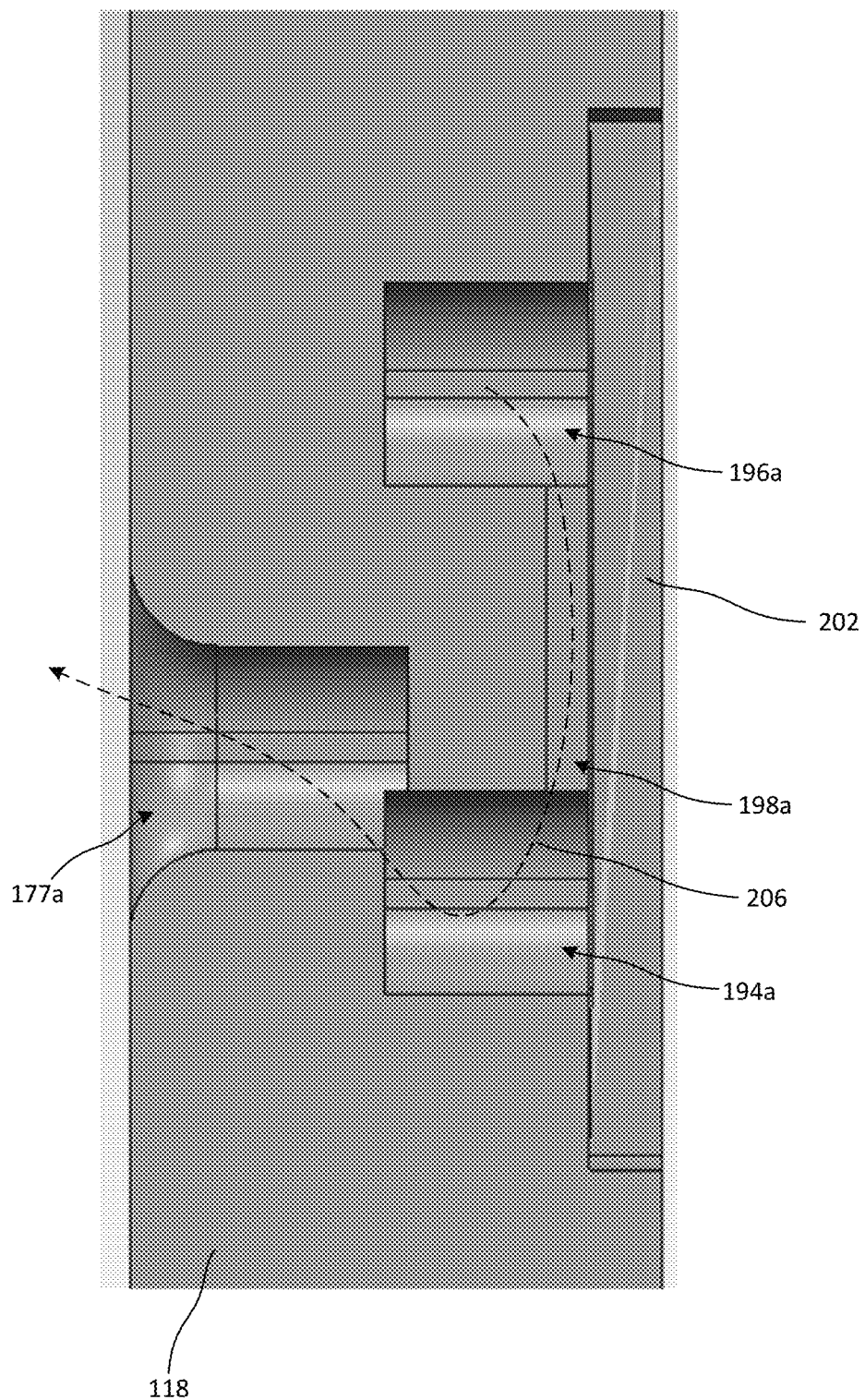
FIG. 4 is a cross-sectional detail view illustrating a portion of an alternative embodiment of an extraction plate in accordance with the present disclosure.

In various alternative embodiments of the extraction plate 118, the gas slots 177a, 177b, slot conduits 194a, 194b, manifold conduits 196a, 196b, and interconnect conduits 198a, 198b may be formed using manufacturing techniques other than cross-drilling. For example, referring to the cross-sectional view shown in FIG. 4, the gas slots 177a, slot conduits 194a, manifold conduits 196a, and interconnect conduits 198a may be formed by routing channels into front and rear surfaces of the extraction plate 118. The routed channels may be sealed with a sealing plate 202 joined (e.g., welded) to a rear of the extraction plate 118. The flow of gas through the conduits is indicated by the dashed line 206. The lower gas slots 177b, slot conduits 194b, manifold conduits 196b, and interconnect conduits 198b of the alternative embodiment of the extraction plate 118 illustrated in FIG. 4 are similar to the gas slots 177a, slot conduits 194a, manifold conduits 196a, and interconnect conduits 198a.

Figure 5:
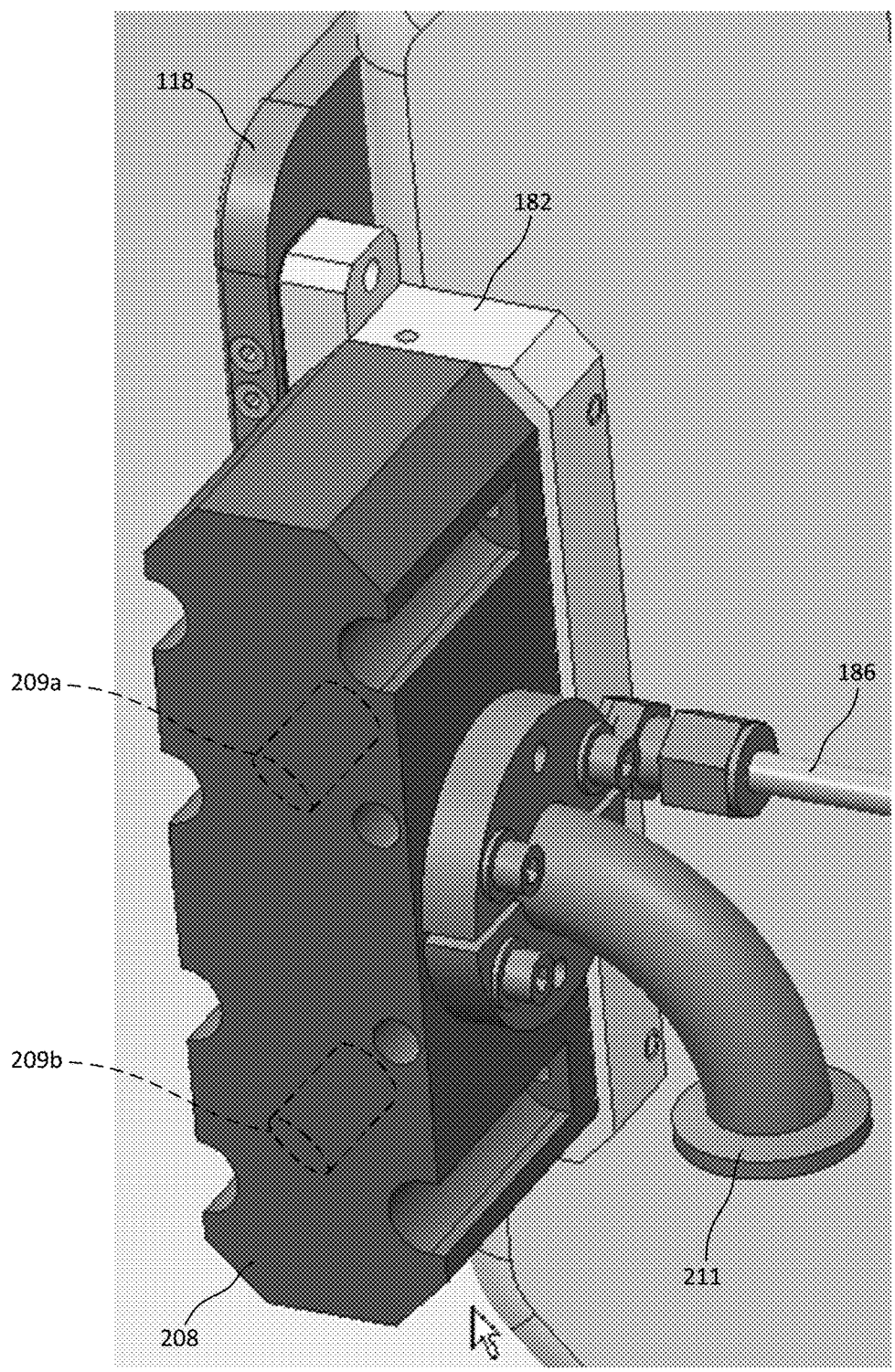
FIG. 5 is a rear perspective view of a gas manifold of the gas injection system shown in FIG. 2.
Figure 6:
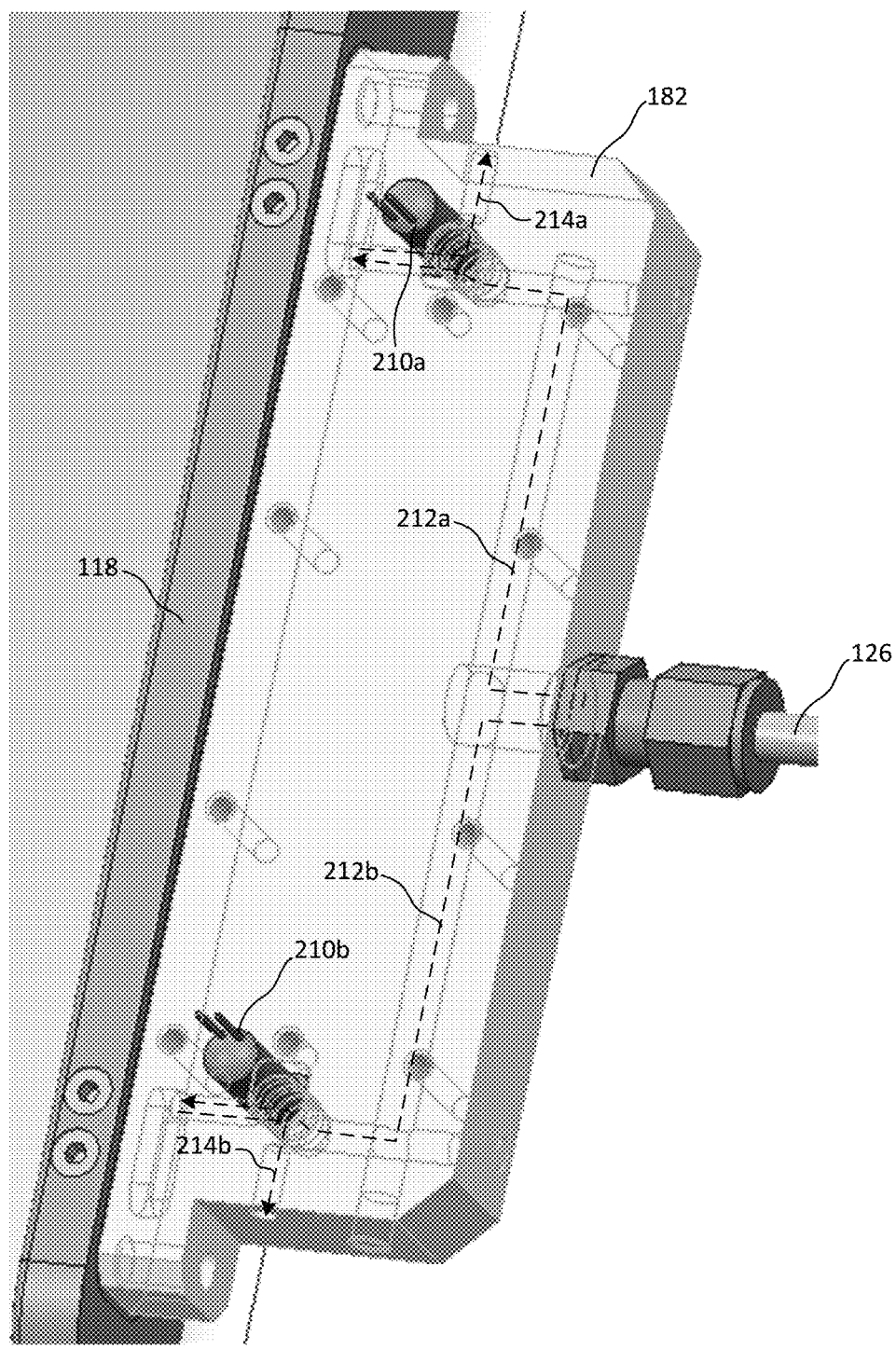
FIG. 6 is a side perspective view of a gas manifold of the gas injection system shown in FIG. 2 with the manifold cover omitted.

Referring to FIGS. 5 and 6, residue removal gas may be supplied to the manifold conduits 196a, 196b (FIG. 3A) through a gas manifold 182 mounted to the rear of the extraction plate 118. Particularly, residue removal gas may enter the gas manifold 182 via the gas supply line 186 and may be channeled through conduits within the gas manifold 182 to the manifold conduits 196a, 196b (FIG. 3A) of the extraction plate 118. A manifold cover 208 may be mounted to the gas manifold 182 and may house one or more electronically-controllable drive mechanisms 209a, 209b (e.g., servo motors) coupled to respective valves 210a, 210b within the gas manifold 182 as further described below. An interior of the manifold cover 208 may be held at atmospheric pressure, and the manifold cover 208 may include a conduit 211 coupled to a backside thereof for routing power and control lines to drive mechanisms 209a, 209b.

Referring to FIG. 6, the valves 210a, 210b in the gas manifold 182 may be 3-way valves adapted for selective adjustability (e.g., through operation of the drive mechanisms 209a, 209b described above) between a first position and a second position. In the first position, the valves 210a, 210b may allow residue removal gas to flow from the gas supply line 186 to the extraction plate 118 as indicated by the arrows 212a, 212b. In the second position, the valves 210a, 210b may allow residue removal gas to flow from the extraction plate 118 to vacuum as indicated by the arrows 214a, 214b. The second position may be appropriate for venting leftover residue removal gas from the extraction plate 118.

Referring again to FIG. 1, the device 100 may include a controller 198 operatively connected to the gas source 188 for controlling the delivery of residue removal gas to the extraction plate 118 in a predetermined (e.g., preprogrammed) manner. For example, the controller 198 may be operatively connected to a drive mechanism 197 for driving the substrate stage 124 (via support arm 199) during scanning of the substrate 122. The controller 198 may be programmed to coordinate the delivery of residue removal gas to the extraction plate 118, and thus the emission of residue removal gas from the gas slots 177a, 177b, with the position and movement of the substrate stage 124 to deliver the residue removal gas to the substrate 122 in a desired manner. In one example, the controller 198 may control a rate of the residue removal gas delivered to the extraction plate 118 for varying the pressure of the residue removal gas emitted from the gas slots 177a, 177b.

Figure 7:
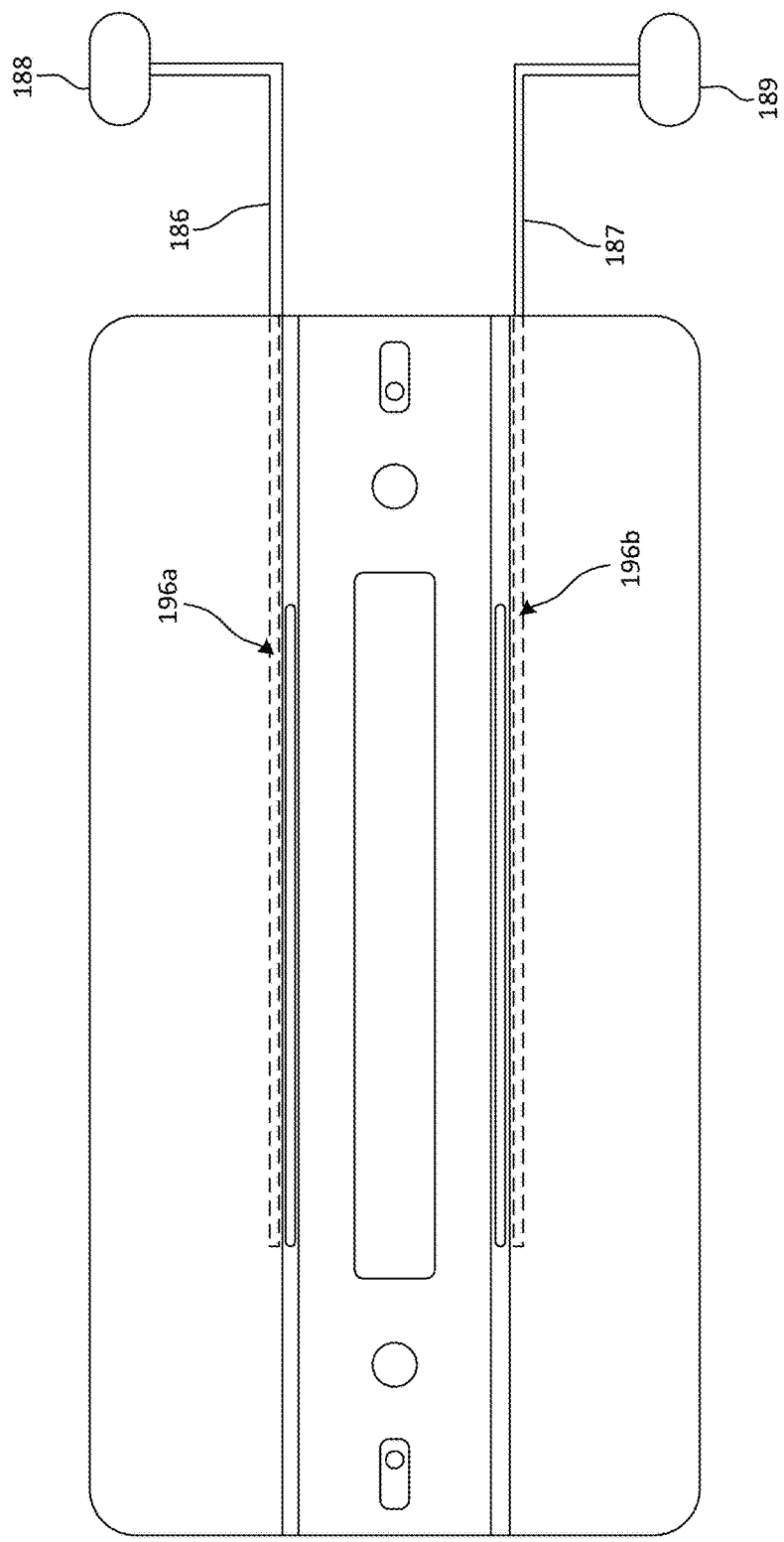
FIG. 7 is a front view illustrating an exemplary alternative embodiment of a gas injection system in accordance with the present disclosure.

Embodiments of the gas injection system 115 are contemplated wherein the extraction plate 118 is provided with a greater or fewer number of gas slots than described above. For example, one of the gas slots 177a, 177b of the extraction plate 118 may be omitted. In other embodiments, the extraction plate 118 may include a plurality of gas slots located above and/or below the extraction aperture 140. In other embodiments, the extraction plate 118 may include one or more gas slots located horizontally adjacent the extraction aperture 140. The number, configuration, and arrangement of the slot conduits 194a, 194b, manifold conduits 196a, 196b, and interconnect conduits 198a, 198b described above may be similarly varied. Additionally, in various alternative embodiments, the extraction plate 118 may be coupled to more than one gas source for supplying different residue removal gases to the extraction plate 118. For example, referring to the alternative embodiment of the gas injection system 115 shown schematically in FIG. 7, the manifold conduit 196a may be coupled to a first gas supply line 186 connected to a first gas source 188 containing a first residue removal gas. The manifold conduit 196b may be coupled to a second gas supply line 187 connected to a second gas source 189 containing a second residue removal gas different from the first residue removal gas.

During operation of the device 100, such as for etching a substrate 122 disposed on the substrate stage 124 as shown in FIG. 1, the substrate stage 124 may be scanned relative to the extraction plate 118 in the manner described above. For example, the substrate stage 124 may be scanned vertically relative to the extraction plate 118 in order to expose the substrate 122 to the ion beam 120 projected through the extraction aperture 140. As the substrate stage 124 is scanned thusly, residue removal gas supplied by the gas source 188 may be controllably fed through the gas supply line 186 and the gas manifold 182 to the manifold conduits 196a, 196b (FIG. 3A) of the extraction plate 118. The residue removal gas may then flow through the interconnect conduits 198a, 198b to the slot conduits 194a, 194b, whereafter the residue removal gas may be emitted from the gas slots 177a, 177b. Thus, the residue removal gas may be sprayed directly onto the moving surface 192 of the substrate 122, with the surface 192 being positioned in close proximity (e.g., 5-25 millimeters) to the gas slots 177a, 177b as the residue removal gas is applied thereto.

Figure 8:
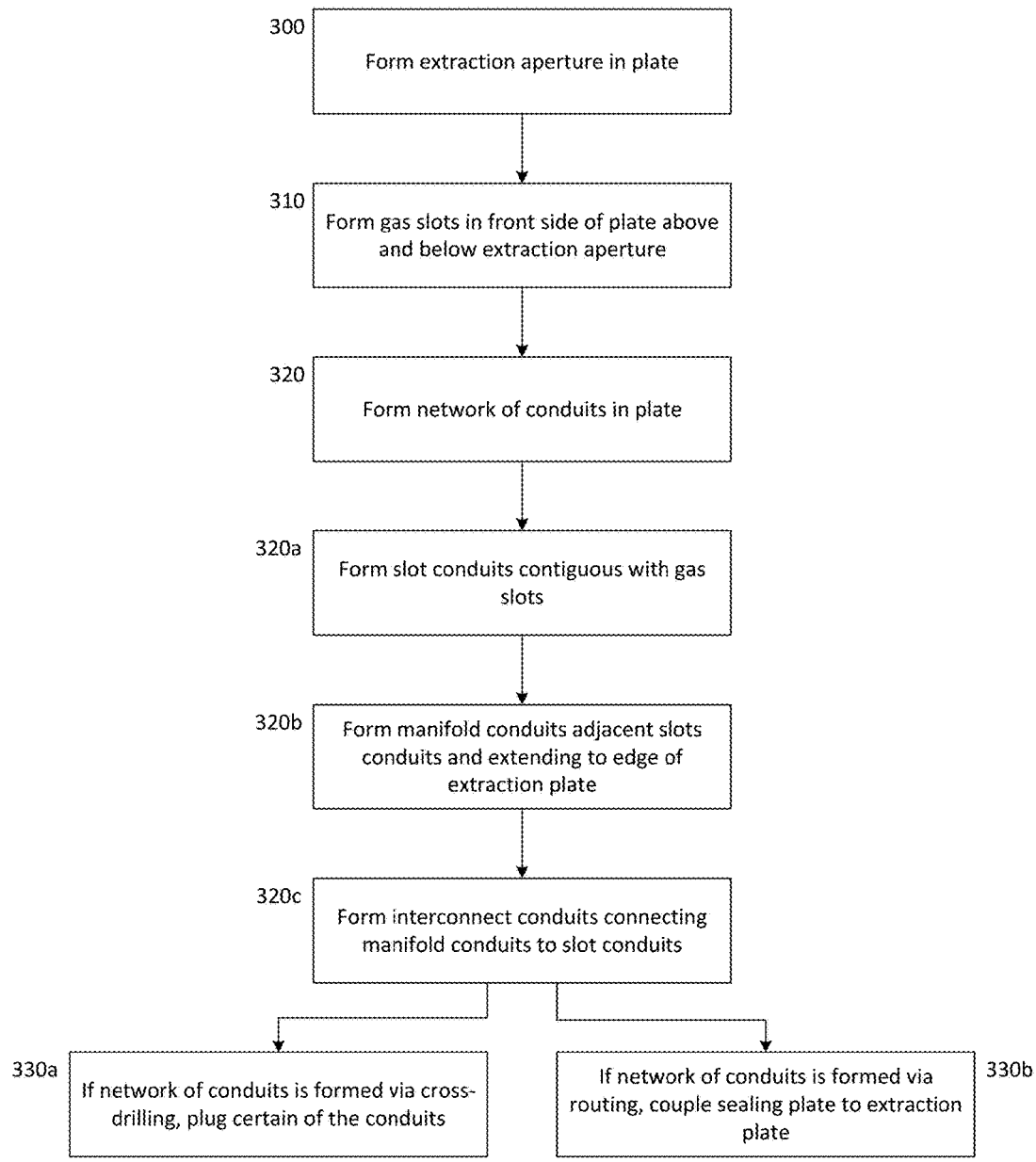
FIG. 8 is a flow diagram illustrating an exemplary embodiment of method for manufacturing an extraction plate for a gas injection system in accordance with the present disclosure.

Referring to FIG. 8, a flow diagram illustrating an exemplary method for manufacturing an extraction plate for a gas injection system in accordance with the present disclosure is shown. The method will now be described in detail with reference to the embodiments of present disclosure shown in FIGS. 1-7.

At block 300 of the exemplary method, the extraction aperture 140 may be formed in the extraction plate 118 for allowing pass-through of the ion beam 120. At block 310 of the method, the gas slots 177a, 177b may be formed in a first, front side of the extraction plate 118 above and below the extraction aperture 140, respectively. At block 320 of the method, a network of conduits may be formed in the extraction plate 118 for facilitating delivery of a residue removal gas to the gas slots 177a, 177b.

Forming the network of conduits in the aperture plate 118 may include, at block 320a of the exemplary method, forming the slot conduits 194a, 194b extending through the extraction plate 118 and contiguous with the gas slots 177a, 177b, respectively. Forming the network of conduits in the aperture plate 118 may further include, at block 320b of the exemplary method, forming the manifold conduits 196a, 196b located adjacent the slot conduits 194a, 194b, respectively, and extending to one or more edges of the extraction plate 118 for coupling to the gas manifold 182. Forming the network of conduits in the aperture plate 118 may further include, at block 320c of the exemplary method, forming the interconnect conduits 198a, 198b extending between the manifold conduits 196a, 196b and the slot conduits 194a, 194b for providing fluid communication therebetween.

As described above, the network of conduits, including the interconnect conduits 198a, 198b, the manifold conduits 196a, 196b, and the slot conduits 194a, 194b, may be formed by cross-drilling the aperture plate 118 in directions parallel to the first, front side of the aperture plate 118 from corresponding edges of aperture plate 118. If the network of conduits is formed thusly, certain of the cross-drilled bores (e.g., the cross-drilled bores forming the interconnect conduits 198a, 198b) may, at block 330a of the exemplary method, subsequently be plugged to prevent gas from escaping the aperture plate 118. In another contemplated embodiment, the interconnect conduits 198a, 198b, the manifold conduits 196a, 196b, and the slot conduits 194a, 194b, may be formed by routing intersecting channels in the first, front side of the aperture plate 118 and the second, opposing rear side of the aperture plate 118 as depicted in FIG. 4. If the network of conduits is formed thusly, the sealing plate 202 may, at block 330b of the exemplary method, be coupled to the rear side of the aperture plate 118 to seal the network of conduits as depicted in FIG. 4.

Referring again to FIG. 1, owing to the relatively short distance between the gas slots 177a, 177b and the surface 192 of the substrate 122, the gas injection system 115 may apply residue removal gas to the surface 192 at a lower flow rate and at a higher pressure relative to conventional shower head gas delivery systems. Advantageously, the residue removal gas emitted from the gas slots 177a, 177b of the gas injection system 115 is relatively concentrated and undiffused when received by the surface 192. The configuration of the present disclosure thus provides higher surface coverage and a higher gas-surface collision rate, thus providing a more effective and more efficient application of residue removal gas relative to conventional shower head gas delivery systems. Thus, the total amount of residue removal gas necessary for processing a substrate may be reduced while the efficacy of the residue removal gas is enhanced relative to conventional shower head gas delivery systems.

As an additional advantage, since there is no need for a separate shower head structure in the process chamber 106, the process chamber 106 may be made smaller, and the device 100 may thus have a smaller form factor, than ion beam devices employing conventional shower head gas delivery systems. As another advantage, since the residue removal gas is emitted from the gas slots 177a, 177b in concentrated steams directly onto the surface 192 of the substrate 122, the residue removal gas may be applied to the surface 192 in a precise, targeted manner before, during, and/or after etching of the substrate 122. In one example, if the substrate stage 124 scans the substrate 122 vertically upwardly during an etching process, starting with the substrate 122 positioned below the extraction aperture 140, the residue removal gas emitted from the gas slot 177a may be applied to the surface 192 of the substrate 122 before the surface 192 is exposed to the ion beam 120. The residue removal gas emitted from the gas slot 177b in the second gas distributor 172a may be applied to the surface 192 of the substrate 122 after the surface 192 is exposed to the ion beam 120. This operation may be particularly advantageous if the residue removal gases emitted from the gas slots 177a, 177b are different residue removal gases.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize its usefulness is not limited thereto. Embodiments of the present disclosure may be beneficially implemented in any number of environments for any number of purposes. Accordingly, the claims set forth below shall be construed in view of the full breadth and spirit of the present disclosure as described herein.

The invention claimed is:

1. A gas injection system for an ion beam device, the gas injection system comprising an extraction plate having an extraction aperture for allowing passage of an ion beam through the extraction plate, the extraction plate further having a gas slot formed therein for facilitating expulsion of gas from the extraction plate.

2. The gas injection system of claim 1, further comprising a gas conduit extending through the extraction plate between the gas slot and a gas manifold mounted to the extraction plate.

3. The gas injection system of claim 2, further comprising a first gas source connected in fluid communication with the gas manifold, the first gas source containing a first residue removal gas.

4. The gas injection system of claim 3, further comprising a second gas source connected in fluid communication with the gas manifold, the second gas source containing a second residue removal gas different than the first residue removal gas.

5. The gas injection system of claim 2, wherein the gas conduit is defined by a bore extending from an edge of the extraction plate through the extraction plate.

6. The gas injection system of claim 2, wherein the gas conduit is defined by a channel formed in at least one of a front surface and a rear surface of the extraction plate.

7. The gas injection system of claim 2, wherein the gas manifold includes a valve selectively adjustable between a first position, wherein the gas is allowed to flow into the extraction plate, and a second position, wherein the gas can be vented from the extraction plate to a surrounding atmosphere.

8. The gas injection system of claim 7, further comprising a manifold cover coupled to the gas manifold, the manifold cover including an electronically-controllable drive mechanism coupled to the valve and adapted to move the valve between the first position and the second position.

9. The gas injection system of claim 1, wherein the gas slot is directed away from the ion beam.

10. The gas injection system of claim 1, wherein the gas slot is a first gas slot located on a first side of the extraction aperture, the gas injection system further comprising a second gas slot located on a second side of the extraction aperture opposite the first side.

11. A gas injection system for an ion beam device, the gas injection system comprising:
    an extraction plate having an extraction aperture for allowing passage of an ion beam through the extraction plate, the extraction plate further having a gas slot for facilitating expulsion of a residue removal gas from the extraction plate;
    a gas conduit extending through the extraction plate between the gas slot and a gas manifold mounted to the extraction plate;
    a gas source connected in fluid communication with the gas manifold, the gas source containing the residue removal gas, the gas manifold including a valve selectively adjustable between a first position, wherein the residue removal gas is allowed to flow into the extraction plate, and a second position, wherein the residue removal gas can be vented from the extraction plate; and
    a manifold cover coupled to the gas manifold, the manifold cover including an electronically-controllable drive mechanism coupled to the valve and adapted to move the valve between the first position and the second position.

12. A method of manufacturing an extraction plate for a gas injection system, the method comprising:
    forming an elongated extraction aperture in a plate;
    forming a gas slot in a first side of the plate on a first side of the extraction aperture; and
    forming a network of conduits in the plate for putting the gas slot in fluid communication with a gas source, the network of conduits including a slot conduit intersecting the gas slot.

13. The method of claim 12, wherein the network of conduits further comprises:
    a manifold conduit extending from an edge of the plate; and
    an interconnect conduit extending between the manifold conduit and the slot conduit.

14. The method of claim 12, wherein forming the network of conduits comprises cross-drilling bores into the plate in a direction parallel to the first side of the plate.

15. The method of claim 14, further comprising plugging at least one of the bores.

16. The method of claim 12, wherein forming the network of conduits comprises routing channels into at least one of the first side of the plate and a second side of the plate opposite the first side.

17. The method of claim 16, wherein the channels intersect with one another.

18. The method of claim 16, further comprising sealing the channels by coupling a sealing plate to the second side of the plate.

19. The method of claim 12, wherein the gas slot is a first gas slot, the method further comprising forming a second gas slot in the first side of the plate on a second side of the extraction aperture opposite the first side of the extraction aperture.

20. The method of claim 19, wherein the gas source is a first gas source and the network of conduits is a first network of conduits, the method further comprising forming a second network of conduits in the plate for putting the second gas slot in fluid communication with a second gas source different from the first gas source.

* * * * *